United States Patent [19]
Shi et al.

[11] Patent Number: 5,821,891
[45] Date of Patent: Oct. 13, 1998

[54] SECOND ORDER DEMODULATOR FOR SIGMA-DELTA DIGITAL TO ANALOG CONVERTER

[75] Inventors: Zhongming Shi, San Diego; Ken Hsu, Irvine, both of Calif.; Kim Kaltiokallio, Salo, Finland

[73] Assignee: Nokia Mobile Phones, Ltd., Finland

[21] Appl. No.: 777,172

[22] Filed: Dec. 26, 1996

[51] Int. Cl.$^6$ .................................................. H03M 3/00
[52] U.S. Cl. ............................................................. 341/143
[58] Field of Search .................................. 341/143, 144, 341/150

[56] References Cited

U.S. PATENT DOCUMENTS

| | | | |
|---|---|---|---|
| 5,072,219 | 12/1991 | Boutaud et al. | 341/150 |
| 5,206,648 | 4/1993 | Yukawa | 341/143 |
| 5,313,205 | 5/1994 | Wilson | 341/144 |
| 5,412,387 | 5/1995 | Vincelette et al. | 341/150 |
| 5,461,381 | 10/1995 | Seaberg | 341/143 |
| 5,563,597 | 10/1996 | McCartney | 341/150 |

OTHER PUBLICATIONS

Kwan, et al., "A Stereo Multi–Bit $\Sigma\Delta$ D/A with Asynchronous Master Clock Interface", 1996 IEEE International Solid–State Circuits Conference, Feb. 1996, pp. 226–227.

Shi, et al., "A 2.4 V, 700 $\mu$w, 0.18 MM$^2$ Second–Order Demodulator for High–Resolution $\Sigma\Delta$ DAC's", IEEE Custom Integrated Circuits Conference 1997, May 1997, v Session 13, Paper 13.3.

*Primary Examiner*—Jeffrey A. Gaffin
*Assistant Examiner*—Jason L. W. Kost
*Attorney, Agent, or Firm*—Brown, Martin Haller & McClain

[57] ABSTRACT

A demodulator subsystem incorporates second-order filtering for use within a sigma-delta DAC. A conventional demodulator is modified to include circuitry which manifests a second-order filtering response to the output of the demodulator. The added circuitry includes an additional pair of phased switched capacitor legs and a fixed capacitor. The combination of the additional circuitry with the existing phase switched and fixed capacitors of the conventional demodulator creates an additional pole which provides second order filtering to the demodulator output, effectively eliminating the high-order post filtering and minimizing both the circuit area required for implementation of the demodulator and its power consumption.

8 Claims, 7 Drawing Sheets

SECOND ORDER DEMODULATOR FOR SIGMA-DELTA DIGITAL TO ANALOG CONVERTER

BACKGROUND OF THE INVENTION

1. Field of the Invention

The present invention relates generally to a digital-to-analog converter system and more particularly to a digital-to-analog converter (DAC) which requires less power and contains fewer components than traditional DACs.

2. Description of the Related Art

Mixed signal systems, i.e., systems using both analog and digital technologies, have expanded into virtually every field of electronics, including the field of wireless communications. Such systems require conversion of analog signals to digital signals (ADC) and digital signals to analog signals (DAC), which are typically achieved by sampling the digital signal or analog signal at a particular time interval. This sampling is ordinarily done at greater than twice the frequency rate of the highest frequency represented in the signal being sampled. Such over-sampling frequency is generally called the Nyquist rate, and ensures that the signal being sampled is correctly represented in the conversion process. However, classical DACs are limited in the length of a data world. Therefore, the level of resolution that can be handled, becomes an issue when dealing with telecommunications signals. One possible solution is to sample the signal at a rate considerably larger than the Nyquist rate to reduce noise power per unit frequency to permit higher word length. This results in a reduced signal speed, which, even with a significant speed reduction, may only produce a one bit improvement in word length capability.

Another solution to increase word length which has been adopted in the telecommunications industry is the use of sigma-delta modulation, which is becoming wide-spread because the circuits used in its implementation are primarily digital and tolerant of low-precision analog components, and provide high quality audio signals. In addition to the increased word length, a significant advantage of the use of sigma-delta modulators is that it permits high precision data converters to be integrated alongside complex digital circuits using conventional VLSI fabrication processes. The sigma-delta DACs that are incorporated into the modulators, often referred to as "one bit" or "single bit" DACS, use an architecture quite different from classical DACs, with a serial stream of digital bits representing the output value being fed to the DAC. The sigma-delta DAC, which is configured as an anti-imaging filter, digitally filters the input stream, and feeds the filtered output bits to a modulator circuit which develops the average value of the bits. A low-pass analog filter follows to eliminate residual errors and glitches.

A sigma-delta DAC, shown in the block diagram of FIG. 15, incorporates a modulation process which manipulates the noise spectrum of an input signal so that the majority of the noise power is positioned outside the frequency range of interest, or the signal bandwidth. This noise is often referred to as "quantization noise", while the process of moving the noise outside the signal bandwidth is referred to as "noise shaping." The sigma-delta architecture includes oversampling digital filters 1502, a sigma-delta modulator 1504 and demodulator 1506, and a post analog low-pass filter. The over-sampling digital filter, such as an interpolator and sync filter, provides a digital signal to the sigma-delta modulator which then provides noise shaping outside of the signal band. Connected to the output of the modulator is the demodulator, usually a switched-capacitor type, which converts the noise shaped digital signal into an analog signal while simultaneously providing first-order low-pass filtering. The first-order low-pass noise filtering within the demodulator may be insufficient for the high quality audio signals demanded in today's communication systems. As a result, it is necessary to supplement the first-order low-pass filtering with additional low-pass analog filtering. For the high resolution needs of telecommunications where a high order sigma-delta modulator is used, such additional filtering should also be of a high-order to remove any digital noise, such as glitches, from the analog output of the demodulator. The active filter that is used requires an extra operational amplifier, and extra capacitors and resistors.

Major considerations in the production of any portable electronic device, including communication equipment such as cellular telephones, are power consumption and size. As a result, it is advantageous to minimize these parameters, among others, to provide for more efficient products. As discussed above, the sigma-delta DAC requires post filtering to the analog output from the DAC demodulator in order to minimize the digital noise generated within the DAC. The additional post filtering circuitry increases the power consumption, chip size, and cost of the circuitry. Such additional circuitry, for example, would include a variety of lumped components in combination with an operational amplifier to create a low-pass filter of at least a second order. Especially in high resolution applications where the frequency range of interest is relatively low and narrow, such as for speech, the lumped components would include large capacitors and resistors to achieve the large time constants necessary for filtering the low frequency signals. These components provide a further disadvantage of low precision due to possible process variation during assembly.

As a result of the above; it would be advantageous to integrate the high-order filtering directly into circuitry of the demodulator of the sigma-delta DAC. Such integration would thereby eliminate the additional lumped components and operational amplifier, resulting in a demodulator which consumes less power and occupies less chip area than a traditional demodulator used in a sigma-delta DAC.

SUMMARY OF THE INVENTION

Accordingly, the present invention is directed to a demodulator for use in a sigma-delta DAC that overcomes the problems and deficiencies of the related art. More specifically, the present invention overcomes the problem of requiring a separate second-order post analog filter following the demodulator within the DAC to remove the higher frequency digital noise.

In an exemplary embodiment, a conventional demodulator is modified to include circuitry which manifests a second-order filtering response to the output of the demodulator for use within a sigma-delta DAC. The second order filter circuitry includes an additional pair of switched capacitor legs and a fixed capacitor. The combination of the additional circuitry with the existing switched and fixed capacitors of the conventional demodulator effectively creates an additional pole which provides second order filtering at the demodulator output, eliminating the need for high-order post filtering that is used with conventional demodulators. Elimination of the need for the high-order post filtering in turn minimizes the circuit area required for the implementation of the demodulator, decreases the number of active components necessary for the DAC, thereby lowering the power consumption of the device, and minimizing the cost of manufacturing the DAC.

BRIEF DESCRIPTION OF THE DRAWINGS

Understanding the present invention will be facilitated by consideration of the following detailed description of a preferred embodiment of the present invention taken in conjunction with the accompanying drawings, in which like numeral refer to like parts and in which.

DETAILED DESCRIPTION OF THE PREFERRED EMBODIMENT

Figure 1:
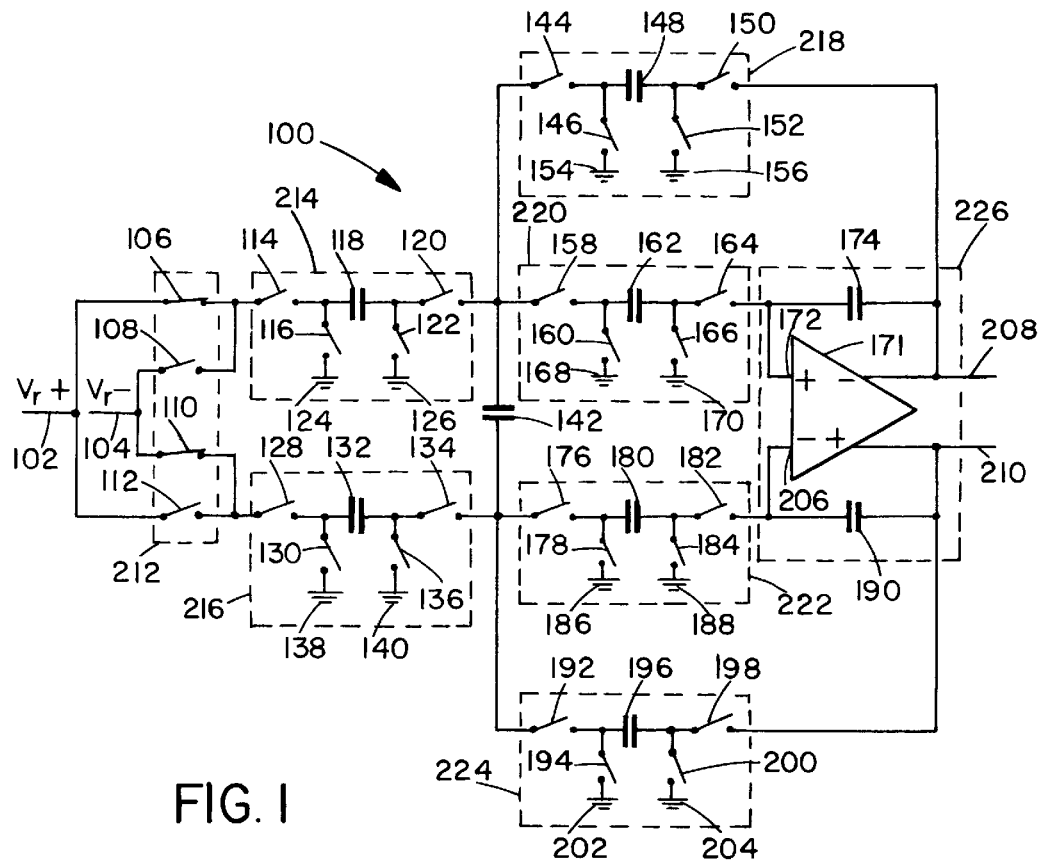
FIG. 1 is a schematic of the demodulator of the present invention showing the switched capacitor network which accomplishes the second order filtering.

Referring initially to FIG. 1, the demodulator of the present invention is shown and generally designated by reference numeral 100. The numerous components contained in demodulator 100 are provided in Table 1, and will be discussed in detail in the conjunction with FIG. 1.

TABLE 1

| Reference No. | Designator | Signal Name/Description |
|---|---|---|
| 102 | $V_r^+$ | Positive Voltage Reference |
| 104 | $V_r^-$ | Negative Voltage Reference |
| 106 | D | Digital input signal |
| 108 | D | Inverted Digital input signal |
| 110 | D | Digital input signal |
| 112 | D | Inverted Digital input signal |
| 114 | S1 | Phase 1 of the switch clock |
| 116 | S2 | Phase 2 of the switch clock |
| 118 | C1 | Switched capacitor |
| 120 | S3 | Phase 3 to the switch clock |
| 122 | S4 | Phase 4 to the switch clock |
| 124 | Gnd | ground connection |
| 126 | Gnd | ground connection |

TABLE 1-continued

| Reference No. | Designator | Signal Name/Description |
|---|---|---|
| 128 | S1 | Phase 1 of the switch clock |
| 130 | S2 | Phase 2 of the switch clock |
| 132 | C1 | Switched capacitor |
| 134 | S3 | Phase 3 of the switch clock |
| 136 | S4 | Phase 4 of the switch clock |
| 138 | Gnd | ground connection |
| 140 | Gnd | ground connection |
| 142 | C5 | Capacitor |
| 144 | S3 | Phase 3 of the switch clock |
| 146 | S4 | Phase 4 of the switch clock |
| 148 | C3 | Switched capacitor |
| 150 | S1 | Phase 1 of the switch clock |
| 152 | S2 | Phase 2 of the switch clock |
| 154 | Gnd | ground connection |
| 156 | Gnd | ground connection |
| 158 | S1 | Phase 1 of the switch clock |
| 160 | S2 | Phase 2 of the switch clock |
| 162 | C4 | Switched capacitor |
| 164 | S3 | Phase 3 of the switch clock |
| 166 | S4 | Phase 4 ot the switch clock |
| 168 | Gnd | ground connection |
| 170 | Gnd | ground connection |
| 171 | OPA | Differential Op. Amp. |
| 172 | $V_{in}^+$ | positive input voltage |
| 174 | C2 | Capacitor |
| 176 | S1 | Phase 1 of the switch clock |
| 178 | S2 | Phase 2 of the switch clock |
| 180 | C4 | Switched capacitor |
| 182 | S3 | Phase 3 of the switch clock |
| 184 | S4 | Phase 4 of the switch clock |
| 186 | Gnd | ground connection |
| 188 | Gnd | ground connection |
| 190 | C2 | Capacitor |
| 192 | S3 | Phase 3 of the switch clock |
| 194 | S4 | Phase 4 of the switch clock |
| 196 | C3 | Switched capacitor |
| 198 | S1 | Phase 1 of the switch clock |
| 200 | S2 | Phase 2 of the switch clock |
| 202 | Gnd | ground connection |
| 204 | Gnd | ground connection |
| 206 | $V_{in}^-$ | negative input voltage |
| 208 | $V_{out}^-$ | negative output voltage |
| 210 | $V_{out}^+$ | positive output voltage |

In addition to the labeling of individual components, demodulator 100 has been partitioned into circuit blocks 212, 214, 216, 218, 220, 222, 224, and 226. Circuit block 212 includes switches 106, 108, 110, and 112. As shown, switches 106 and 112 are both connected to the positive reference input voltage 102, and switches 108 and 110 are connected to the negative reference input voltage 104. The positive and negative reference voltage inputs are analog voltages which set the maximum amplitude of the analog output of the demodulator. The position of the switches 106, 108, 110, and 112 (whether the switch is open or closed) is determined by the incoming digital signal "D" (not shown). As illustrated, switches 108 and 112 are switched to an open position and switches 106 and 110 are switched to a closed position, which is indicative of the digital input signal "D" being positive (e.g. 1 volt). Conversely, when the digital input signal "D" is negative (e.g. 0 volts), switches 108 and 112 are switched to a closed position and switches 106 and 110 are switched to an open position. (This condition is not illustrated). As a result of the complementary switching, when the digital input signal "D" is positive, the circuit block 214 is provided with a relatively positive logic reference voltage value, i.e., a "1", from reference 102, and the circuit block 216 is provided with a relatively negative logic reference voltage value, i.e., a "0", from reference 104, so that circuit blocks 214 and 216 are driven with opposite voltages regardless of the polarity of the value of incoming digital signal "D."

The outputs from switches 106 and 108 are connected to circuit block 214, and the outputs from switches 110 and 112 are connected to circuit block 216. Circuit block 214 includes an input switch 114 whose output is connected to input grounding switch 116 and the input to capacitor 118. The output of capacitor 118 is connected to output switch 120 and output grounding switch 122. Switches 114, 116, 120, and 122 are controlled by the four phases of the switch clock (not shown) The switch clock generates the control signals which control the positioning of the switches in circuit block 214, as well as all other capacitor switches shown in FIG. 1. The switch clock produces four control signals with each having a different phase. These phases will be discussed more completely in conjunction with FIG. 3, however, it should be recognized that switches 114, 116, 120, and 122 are individually controlled to cooperatively charge and discharge capacitor 118. As indicated above in the tabulated list of components, switches 114, 116, 120 and 122 are controlled by clock phases 1, 2, 3, and 4, respectively. Circuit block 216 is substantially identical to circuit block 214, with switches 128, 130, 134, and 136 being controlled similarly to switches 114, 116, 120, and 122, respectively.

Circuit blocks 214 and 216 provide outputs which are connected across capacitor 140, with the output of block 214 also being connected to the input of circuit blocks 218 and 220, and the output of block 216 being connected to the input of circuit blocks 222 and 224. Focussing initially on the connection with capacitor 142, since circuit blocks 214 and 216 provide differential signals based on their complementary reference voltage inputs, the voltages across capacitor 142 will vary with the polarity of the incoming digital signal "D", and the switching of capacitors 118 and 132.

The input to circuit block 218 connects to input switch 144 which is connected to the input of grounding switch 146 and the input to capacitor 148. Like circuit block 214, the output of capacitor 118 is connected to output switch 120 and output grounding switch 122. With reference to circuit blocks 214 and 216, it should be appreciated that all circuit blocks containing a capacitor 118 surrounded by an input switch 114, a grounding switch 216, an output switch 220, and a grounding switch 222 are substantially identical. However, the control of the switches will vary from circuit block to circuit block. In particular, switches 144, 146, 150, and 152 are controlled by clock phases 3, 4, 1 and 2, respectively.

Circuit block 220 is also connected to the output of switch 120 and capacitor 142, and contains switches 158, 160, 164, and 166 which operate like switches 144, 146, 150, and 152 of circuit block 218. However, switches 158, 160, 164, and 166 are controlled by clock phases 1, 2, 3, and 4, respectively.

Circuit block 224 is substantially identical and controlled by the same clock phases as circuit block 218 already discussed, and circuit block 222 is substantially identical and controlled by the same clock phases as circuit block 220. As a result, these blocks will not be discussed in detail.

Circuit block 226 includes a differential operation amplifier 171 with its positive input terminal 172 being connected to the output of circuit block 220, and the negative input terminal 206 being connected to the output of circuit block 222. The negative output terminal 208 is connected to the output of circuit block 218 to effectuate a feedback path from the output terminal 208 to the input terminal 172 through circuit blocks 218 and 220. Similarly, the positive output terminal 210 is connected to the output of circuit block 224 to effectuate a feedback path from the output terminal 210 to the input terminal 206 through circuit blocks 224 and 222.

As designed, the demodulator 100 with capacitor 142 and circuit blocks 220 and 222 has a transfer function equivalent to that of a second-order low-pass filter, while providing digital to analog conversion with a gain of the value of capacitor 118 (C1) over the value of capacitor 148 (C3).

Table 2 provides the capacitor values for the preferred embodiment for a telephony application:

TABLE 2

| Reference No. | Capacitor No. | Capacitance |
|---|---|---|
| 118 | C1 | 0.72 pF |
| 132 | C1 | 0.72 pF |
| 142 | C5 | 30 pF |
| 148 | C3 | 0.4 pF |
| 162 | C4 | 0.72 pF |
| 180 | C4 | 0.72 pF |
| 196 | C3 | 0.4 pF |
| 174 | C2 | 5 pF |
| 190 | C2 | 5 pF |

From Table 2, capacitor 118 (C1) has a value of 0.72 picoFarads, and capacitor 148 (C3) has a value of 0.4 picoFarads, which yield an overall demodulator gain of approximately 5.1 dB with a signal having a bandwidth of 3.4 kHz.

Figure 13:
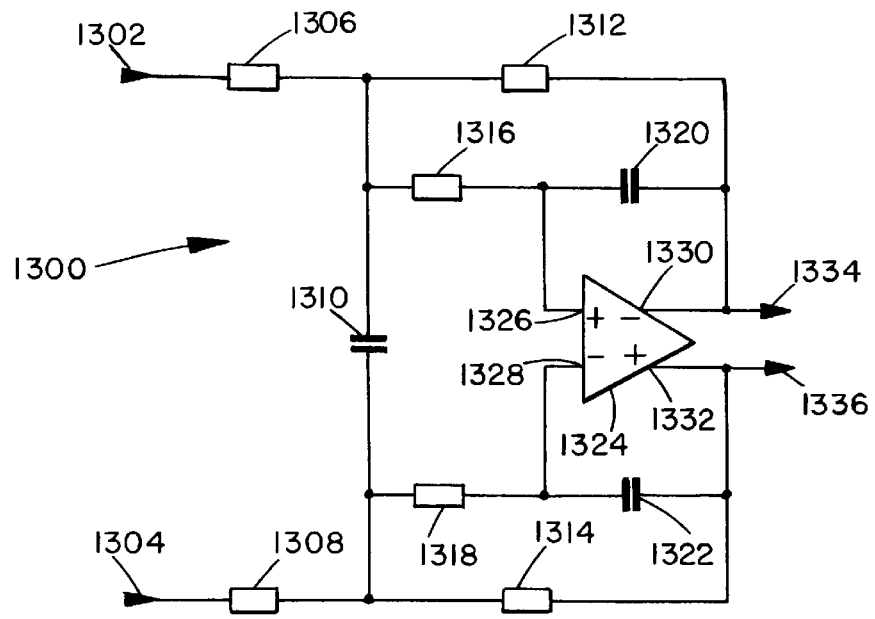
FIG. 13 is a circuit diagram of an equivalent analog circuit for the demodulator of FIG. 1.

Referring ahead briefly to FIG. 13, the equivalent analog circuit to demodulator 100 is shown and generally designated 1300. Circuit 1300 is shown with a pair of inputs 1302 and 1304, with input 1302 being the positive voltage input and 1304 being the negative voltage input. The switched capacitor circuits with capacitors 118, 132, 148, 162, 180, and 196 of demodulator 100 have been replaced by resistor 1306 ($R_1$), resistor 1308 ($R_1$), resistor 1312 ($R_3$), resistor 1316 ($R_4$), resistor 1318 ($R_4$), and resistor 1314 ($R_3$), respectively. The effective complex resistance values for R1, R3, and R4 are determined by the following equations:

$$R_1 = \frac{1}{f_{clock} \cdot C_1}$$

$$R_3 = \frac{1}{f_{clock} \cdot C_3}$$

$$R_4 = \frac{1}{f_{clock} \cdot C_4}$$

where $f_{clock}$ is the input clock frequency for the switching networks. Given the capacitor values for capacitors 118, 132, 142, 148, and 196 of 0.72 pF, 0.72 pF, 30 pF, and 0.4 pF respectively, and the typical clock frequency of 1.28 MHz, the modulator will provide a first pole at approximately 8.6 kHz, and the capacitor values for capacitors 142, 162, and 180 provide a second pole also at approximately 8.6 kHz. The transfer function for demodulator 100 is represented by the following equation.

$$H = -\frac{R_3}{R_1} \cdot \frac{1}{(S+P_1)(S+P_2)}$$

where $R_1$ and $R_2$ are as calculated above. From inspection, it is to be appreciated that the transfer function for the demodulator 100 is essentially a second-order filter transfer function. Solving this equation for the pole frequencies yields an equation for the first complex pole, and the second complex pole, as follows:

$$P_1 = \frac{1}{R_4C_5}\left(1 + \sqrt{1 - 2\frac{R_4C_5}{R_3C_2}}\right)$$

$$P_2 = \frac{1}{R_4C_5}\left(1 - \sqrt{1 - 2\frac{R_4C_5}{R_3C_2}}\right)$$

In analyzing the effect of the switched capacitors within the demodulator 100, it is helpful to briefly discuss the function of switched capacitors in general. Switched capacitors are widely used as a means for creating filters using a purely MOS (metal-oxide-semiconductor) processing technology. Generally speaking, switched capacitors behave like frequency dependent resistors, so long as the signal frequency being passed is much less than the switching frequency of the capacitors. Thus, in order to filter a signal having a frequency in the kilohertz range, it is necessary to switch the capacitors into and out of the circuit at a much higher frequency rate. This high frequency switching is possible because of the fast response of the transistor switches that are used to implement the switching networks. Referring to capacitor 118 and switches 114, 116, 120 and 122 in FIG. 1, each switch is replaced by a transistor (not shown) having a relatively high switching speed, and relatively low on resistance.

Traditional switched capacitor filters have incorporated only a two switch configuration which switched the inputs and outputs of the capacitor, such as switches 114 and 120 of FIG. 1. However, in such configurations, it is possible for a large amount of parasitic switch capacitance to develop, thereby altering the effective capacitance of the circuit. Adding separate switches between the input and output of the capacitor to ground, allows for the discharge of the capacitor to ground, effectively discharging the parasitic switch capacitances as well. As discussed above, the timing and control of the switches, or transistors, is important as it is necessary to prevent the untimely charging or discharging of the capacitors within the circuit.

TABLE 3

SWITCH CONTROL PHASE CHART

| Switch No. | Control Phase | Switch Number | Control Phase |
|---|---|---|---|
| 114 | S1 | 158 | S1 |
| 116 | S2 | 160 | S2 |
| 120 | S3 | 164 | S3 |
| 122 | S4 | 166 | S4 |
| 128 | S1 | 176 | S1 |
| 130 | S2 | 178 | S2 |
| 134 | S3 | 182 | S3 |
| 136 | S4 | 184 | S4 |
| 144 | S3 | 192 | S3 |
| 146 | S4 | 194 | S4 |
| 150 | S1 | 198 | S1 |
| 152 | S2 | 200 | S2 |

Figure 14:
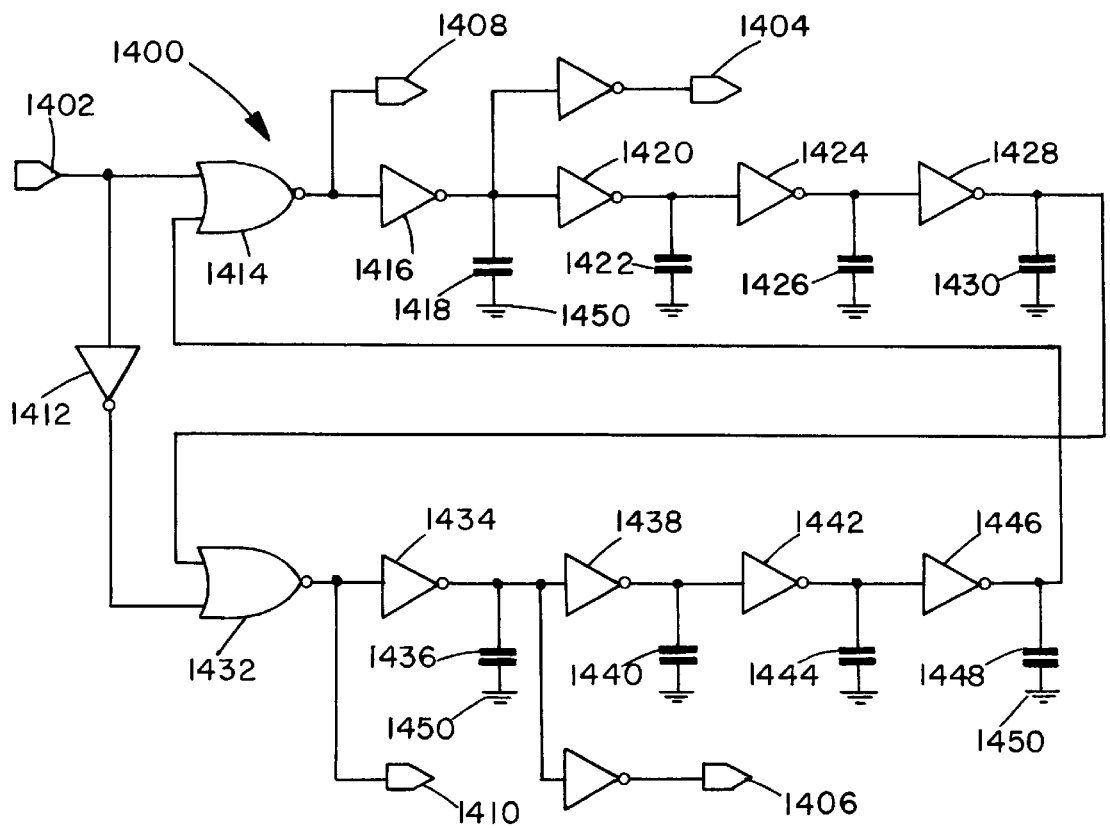
FIG. 14 is a circuit diagram of the clock generator.
Figure 15:
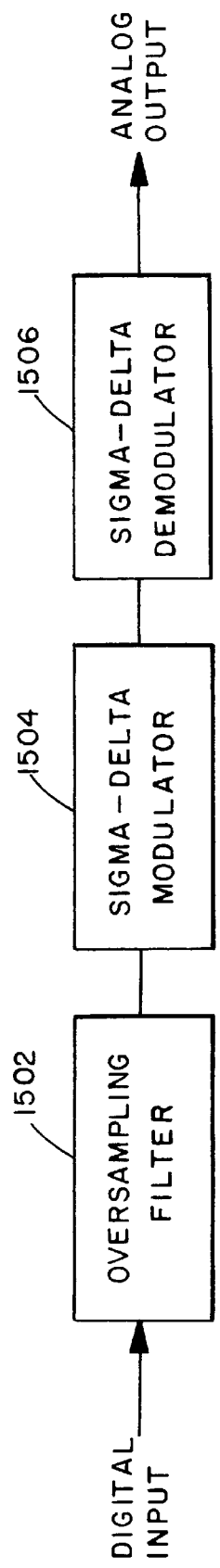
FIG. 15 is a block diagram of a sigma-delta digital-to-analog converter (DAC).

Referring ahead briefly to FIG. 14, the digital circuitry used to generate the various clock phases S1-4 is shown and generally designated 1400. In clock circuit 1400, a digital clock input 1402 with a clock signal having of approximately 1.28 MHz is received, and the circuit generates four output signals corresponding to S1 at 1404, S2 at 1406, S3 at 1408, and S4 at 1410. The incoming clock signal from input 1402 is split between NOR gate 1414 and inverter 1412. The clock signal from input 1402, which is passed through the inverter 1412, is connected to NOR gate 1432. Because the pathways from NOR gate 1414 and NOR gate 1432 are identical, only the pathway associated from NOR gate 1414 will be discussed. (Because the output of each pathway is fed into the NOR gate of the opposite pathway, any timing analysis would necessarily involve analysis of the entire circuit 1400 as a whole.)

Following the NOR gate 1414, output 1408 (S3) is fed through an inverter 1416 whose output is loaded by capacitor 1418 to slow the response time of the inverter, as well as to eliminate any spurious responses caused by the output of the inverter. The output of inverter 1416 is fed to another inverter which generates the output 1404 (S1). The output of inverter 1416 is also fed through three other inverters 1420, 1424, 1428, each having an associated output capacitor 1422, 1426, and 1430, respectively. Finally, the output of inverter 1428 is fed back to the input of NOR gate 1432 to generate output 1410 (S4). The output 1406 is generated in the same manner as output 1404.

The loading capacitors between the inverter outputs and ground 1450 are effective for slowing the propagation speed of the signal through the circuit 1400 as well as increasing the circuit's tolerance for noise, including switching noise. It should be noted, however, that the outputs 1404, 1406, 1408, and 1410 are generated by inverters whose outputs are not loaded with capacitors. This ensures that the rise and fall times for the output signals S1 through S4 are limited only by the slew rate of the inverter, resulting in clock signals having sharp edges.

Figure 2:
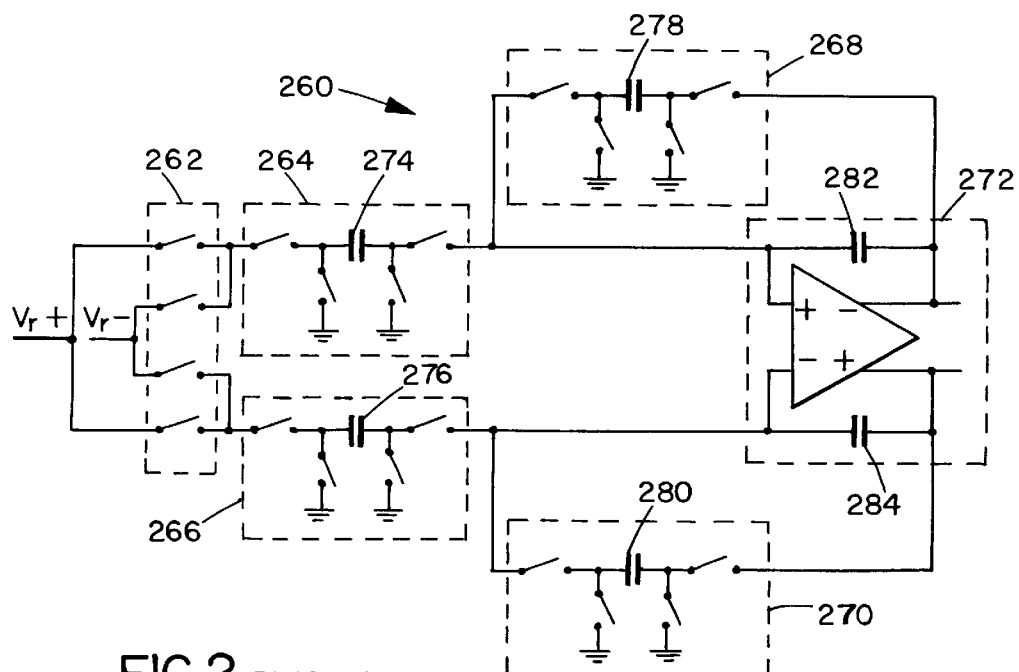
FIG. 2 is a schematic of a prior art demodulator.

Referring to FIG. 2 briefly for comparison purposes, the schematic of a prior art modulator is shown and generally designated 260. The prior art modulator as shown includes some of the same components as the modulator 100, with the omission of the two capacitors C4 (162 and 180), with their associated switch networks, as well as capacitor C5 (142). Prior art modulator 260 has been partitioned into circuit blocks 262, 264, 268, 270 and 272 for ease of discussion. Circuit block 262, like the analogous circuitry in demodulator 100, selects the appropriate polarity of the incoming digital signal for the two signal paths through circuit blocks 264 and 266. Further, circuitry blocks 264 and 266, like the analogous circuitry in demodulator 100, are identical, and provide the necessary phased switching. Circuit blocks 268 and 270, also like the analogous circuitry in demodulator 100, provide additional phased switching. Circuit block 272, like the analogous circuitry in demodulator 100, in combination with the capacitors within blocks 264, 266, 268, and 270, provides the gain for the differential output signal from the demodulator 260.

As designed, the transfer function of the conventional demodulator is equivalent to that of a first-order low-pass filter, where the ratio of the value of capacitor 274 in circuit block 264 and the value of capacitor 278 in circuit block 268 provide the DC gain of the circuit. Also, the combination of the value of capacitor 278 and capacitor 282 in circuit block 272 determine the pole frequency of the first order filtering which occurs within the conventional demodulator 260. Capacitors 274 and 276 have substantially equal values, capacitors 278 and 280 have substantially equal values, and capacitors 282 and 284 have substantially equal values. By matching the values of these capacitors, the output from the demodulator will be symmetrical on both the positive and negative output terminals.

Figure 3:
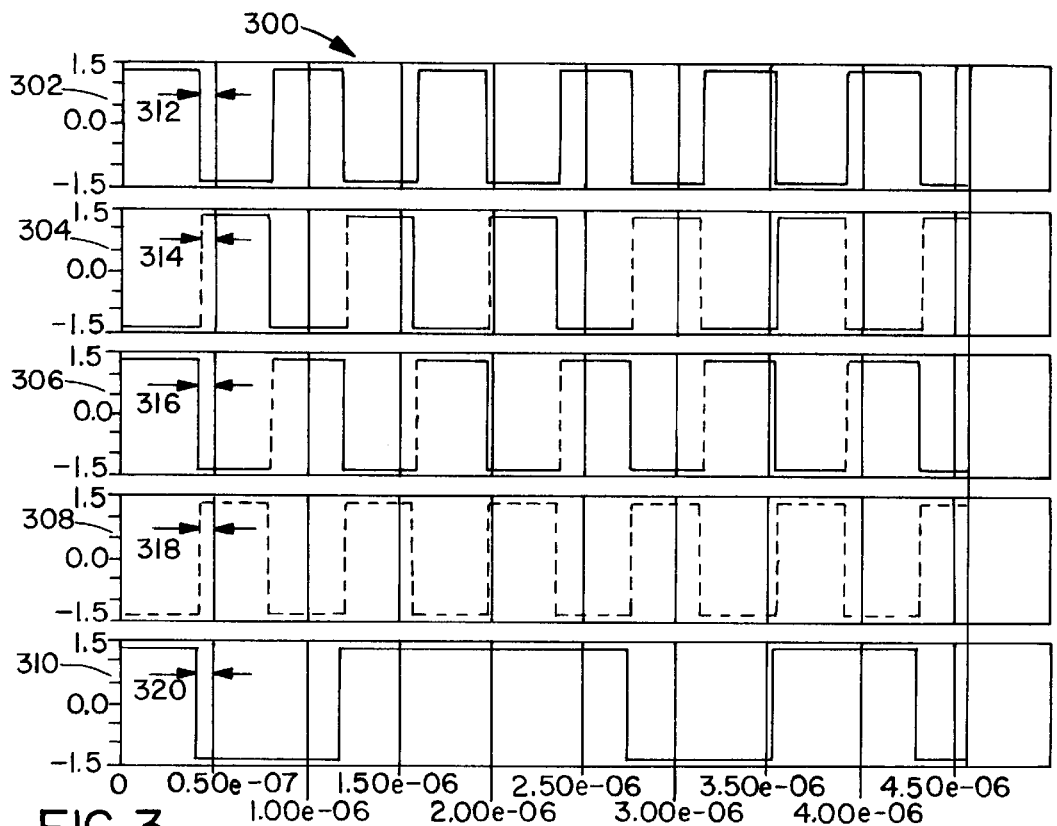
FIG. 3 is a plot showing the timing of switches within the switched capacitor filter.

Referring now to FIG. 3, a plot showing a series of analog traces is shown and generally designated 300. Each trace represents the voltage as a function of time of each waveform. Individual waveforms 302, 304, 306, 308, and 310 represent a plot of S4, S3, S2, S1, and "D," respectively. Referring initially to the waveform 310, which represents the digital data input signal, it can be seen that there are a number of transitions from low to high and high to low. Each of these transitions represents the change from a digital input signal "D" value of "1" to "0" or "0" to "1". Referring back to FIG. 1, the transitions in the digital input signal "D" will force switches 106, 108, 110, and 112 to open, or close, in response to that transition, thereby connecting circuit blocks 214 and 216 to either the positive input reference voltage 102 or the negative input reference voltage 104.

Waveforms 302, 304, 306 and 308 represent the four clock phases which are used to control the positioning of the switches contained within the circuit blocks 214, 216, 218, 220, and 222, discussed above. Comparing the various signal traces in FIG. 3, digital input signal "D" changes state on a rising edge of clock phase S1 shown in trace 308. A digital latch (not shown) may be provided to ensure that the transitions in the digital signal input "D" are presented to the demodulator 100 at predetermined times. Such a latch would typically be inserted between the modulator output and the input control switches 106, 108, 110, and 112, and would be clocked at a rate equivalent to, or an even multiple of, the digital data rate. Thus, the switches would be switched at intervals which would ensure that the digital input signal changes simultaneously, or in substantially contemporaneously with, the first clock phase S1. This is so because the clock phase S1 is derived from the same clock source, as will be discussed in conjunction with FIG. 14. Time measurement 320 shown in trace 310 is slightly longer than the time measurement 318 shown in trace 308 representing S1. This is a result of the propagation delay through the clock generating circuitry, and is not to be understood as a requirement for the proper operation of the demodulator 100. It should also be noted, however, that if digital signal "D" is latched using a clocking signal derived from same clock used for the phase clock signals S1-4, the transitions in the digital signal "D" could occur prior to, or after, the transitions in the phase clocks. In fact, using a digital delay line well known in the art, it would be possible to create virtually any delay period between the transition in the digital signal "D" and the clock phases S1-4.

Comparing traces 302 of S4 and 306 of S2, it is seen that time measurements 312 and 316 are slightly different, and yet in phase with each other. This indicates that the switches controlled by phase S4 will be opened and closed just slightly before those switches controlled by S2. Similarly, comparing traces 304 and 308 indicates that the transition in trace 304 slightly leads a transition in trace 308. This indicates that switches controlled by S3 will be opened or closed just slightly before the switches controlled by S1. These slight delays are important because, referring to circuit block 214 for example, capacitor 118 will be disconnected from circuit blocks 218 and 220 prior to being grounded on its output side.

Figure 4:
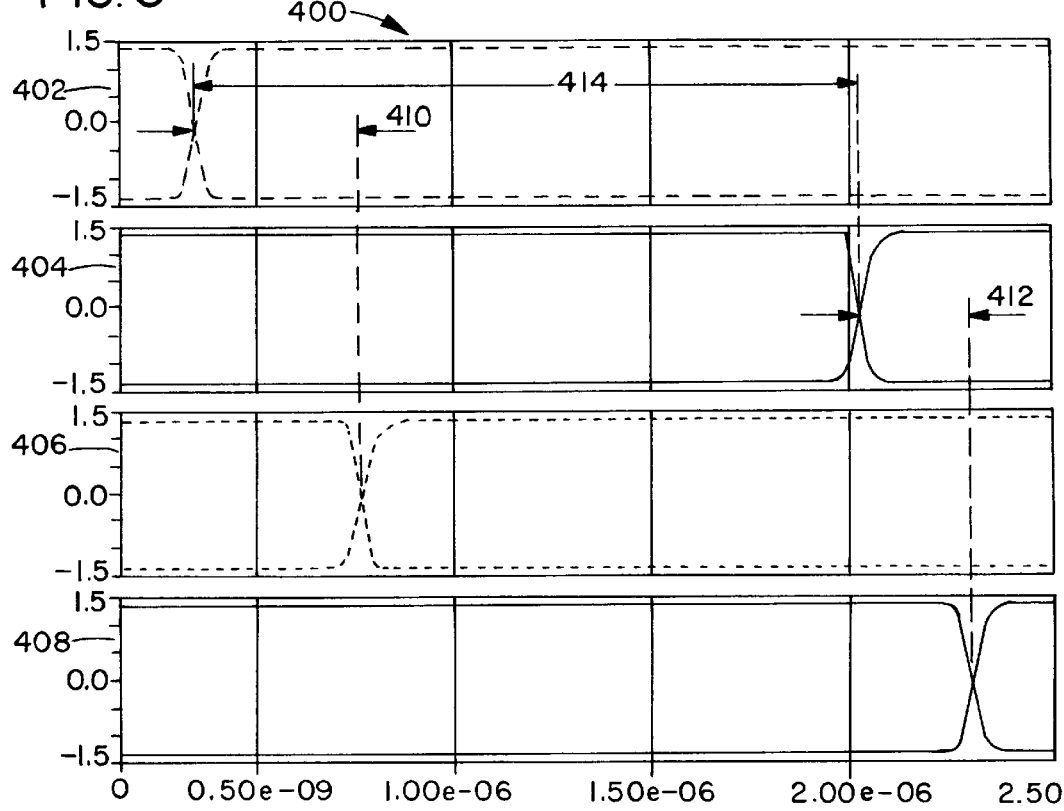
FIG. 4 is a plot of the switch clock for the demodulator.

Referring now to FIG. 4, a more detailed plot of the switch clocks is shown and generally designated 400. Shown in plot 400, traces 402, 404, 406 and 408 represent switch phases S3, S4, S1 and S2, respectively. The time scale of plot 400 is sufficient to allow detection of time measurement 410 between the transition in traces 402 and 406 (S3 and S1) to be approximately 4 nanoseconds, and the time measurement 412 between trace 404 and 408 (S4 and S2) to be approximately 3 nanoseconds. Additionally, plot 400 provides detailed timing information for transitions between trace 402 and 404 (S3 and S4). For example, time measurement 414 is approximately 17 nanoseconds.

Figure 5:
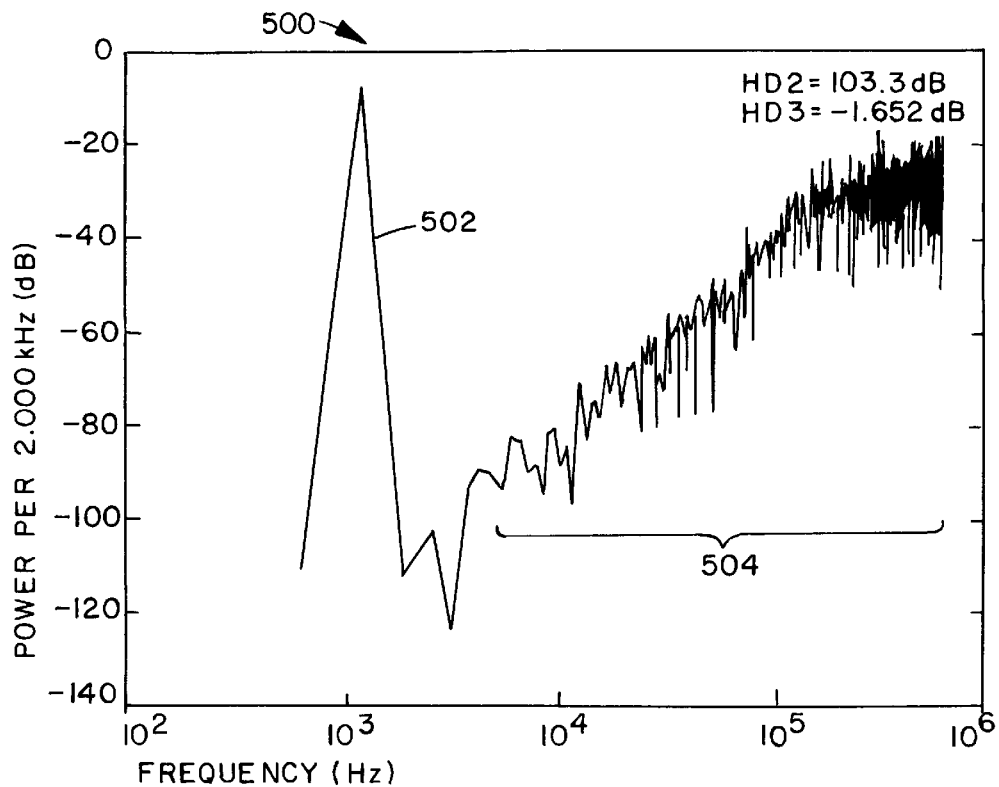
FIG. 5 is a plot of the output spectrum of the second order sigma-delta modulator.

FIG. 5 shows a plot which is generally designated 500. Plot 500 represents the output of a sigma-delta modulator. Generally, a digital filter provides an over-sampled digital signal to the sigma-delta modulator which in turn shapes the output noise pattern to be outside the frequency range of interest. As shown, trace 502 exhibits a spike at 1.25 KHz which is the fundamental frequency of the input signal. The passage of frequencies above the range of interest is high, as can be seen in portion 504 of trace 502, particularly in the frequency range of approximately 100 kHz to 1 MHz, where the signal passes through the demodulator with a level of about −20 dB. While this may not affect the function of equipment within the frequency band of interest, such high frequency noise could cause, or contribute to, aliasing which would result in degraded performance of the DAC, as well as the equipment receiving signals from the DAC.

Figure 6:
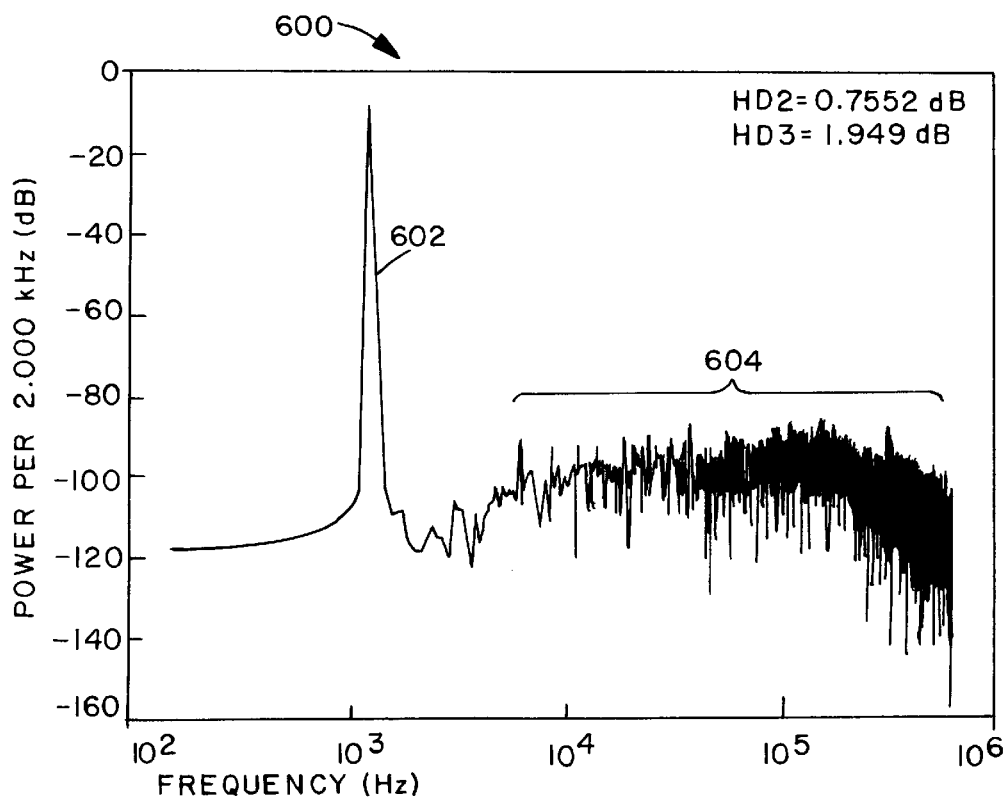
FIG. 6 is a plot of the output spectrum of the second order demodulator.

In comparison to FIG. 5, FIG. 6 shows a plot of the output of a second-order demodulator, which is generally designated 600. In comparison to FIG. 5 showing the output of the sigma-delta modulator, it is apparent that the second-order demodulator can sufficiently remove the quantization noise. By comparing the portion 604 of trace 602 in plot 600 to the portion 504 of trace 502 in plot 500, the high frequency rejection of the second-order demodulator becomes clear: the sigma-delta modulator passes signals that have a strength of up to −20 dB outside the frequency band of interest, while the second-order demodulator passes signals at no greater strength than −80 dB. Thus, the filtration of high frequency noise is greatly improved in the second-order demodulator.

Figure 7:
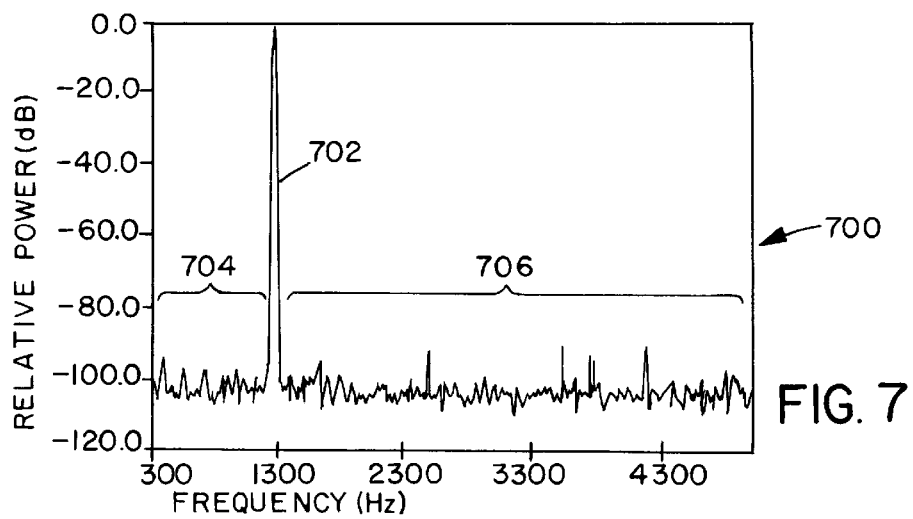
FIG. 7 is a plot showing the measured output power spectrum of the second order demodulator with an input signal of −6.9 dB and 1.25 kHz.

Referring now to FIG. 7, a plot of the measured output power spectrum of the second-order demodulator 100 is shown and generally designated 700. This plot 700 represents the output power measured from the demodulator 100 using an input signal level of −6.9 dB. As shown, trace 702 has a relatively flat noise floor in trace portions 704 and 706, either at or below −100 dB. There are, however, small spurious components above −88 dB, but are attributed to noise contributions from the test fixture and not the demodulator 100.

Figure 8:
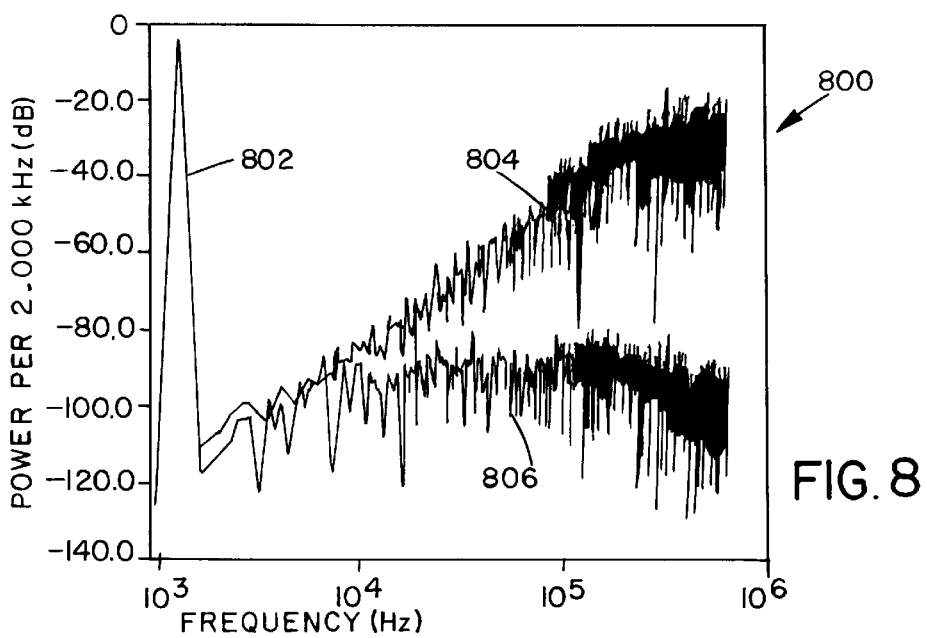
FIG. 8 is a plot showing the simulated output power spectra of a second order sigma-delta modulator and a second-order sigma-delta demodulator.

FIG. 8 shows a plot 800 having a combination of trace 804 and 806. Trace 804 represents the signal input to the demodulator, while the trace 806 represents the signal output from the demodulator. By comparing traces 804 and 806, the benefits the second-order demodulator 100 has on the passage of high frequency noise can be seen since, from approximately 10 kHz, the second order demodulator exhibits a flat signal response of about −100 dB. This represents a great improvement over a non-demodulated signal, and likewise offers an improvement over the conventional sigma-delta DAC which incorporates an analog post filter.

Figure 9:
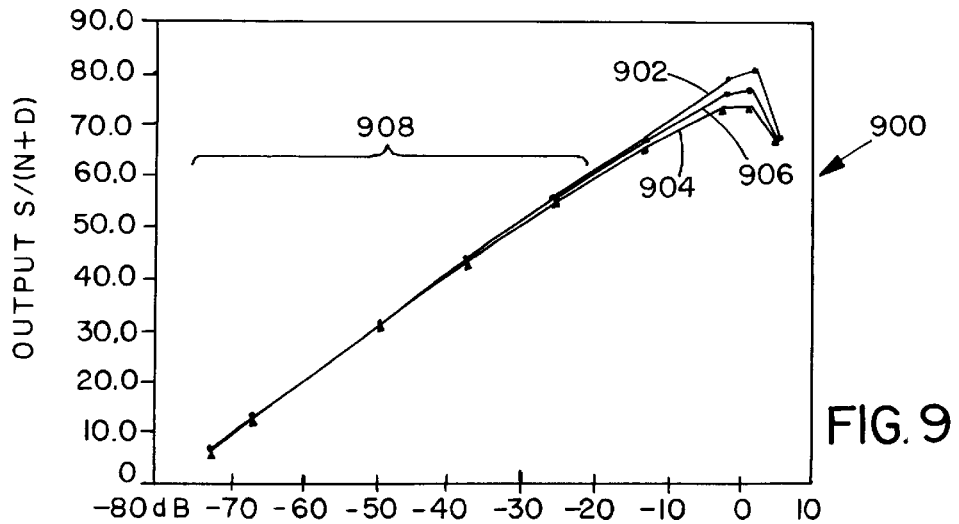
FIG. 9 is a plot showing the output signal-to-noise plus distortion ratio of a second-order demodulator versus input signal level.

Referring now to FIG. 9, plot 900 compares the ratio of signal over noise plus harmonic distortion of the demodulator 100 as a function of input signal level. The 0 dB point on this plot is defined as an input value which allows the demodulator to provide an output amplitude equal to the reference voltage. The input signal frequency uses was 1.125 kHz and the signal to noise and harmonic distortion ratio has been calculated over the bandwidth of 300 Hz to 3.4 kHz. It should be noted, however, that the harmonic distortions are limited primarily by the digital sigma-delta modulator, not by the demodulator itself. Trace 906 represents the average values of the measured ratio of the output signal over noise plus distortion. Traces 902 and 904 represent the plus $3\sigma$ (sigma) standard deviations, and minus $3\sigma$ (sigma) standard deviations of the ratio, respectively.

Figure 10:
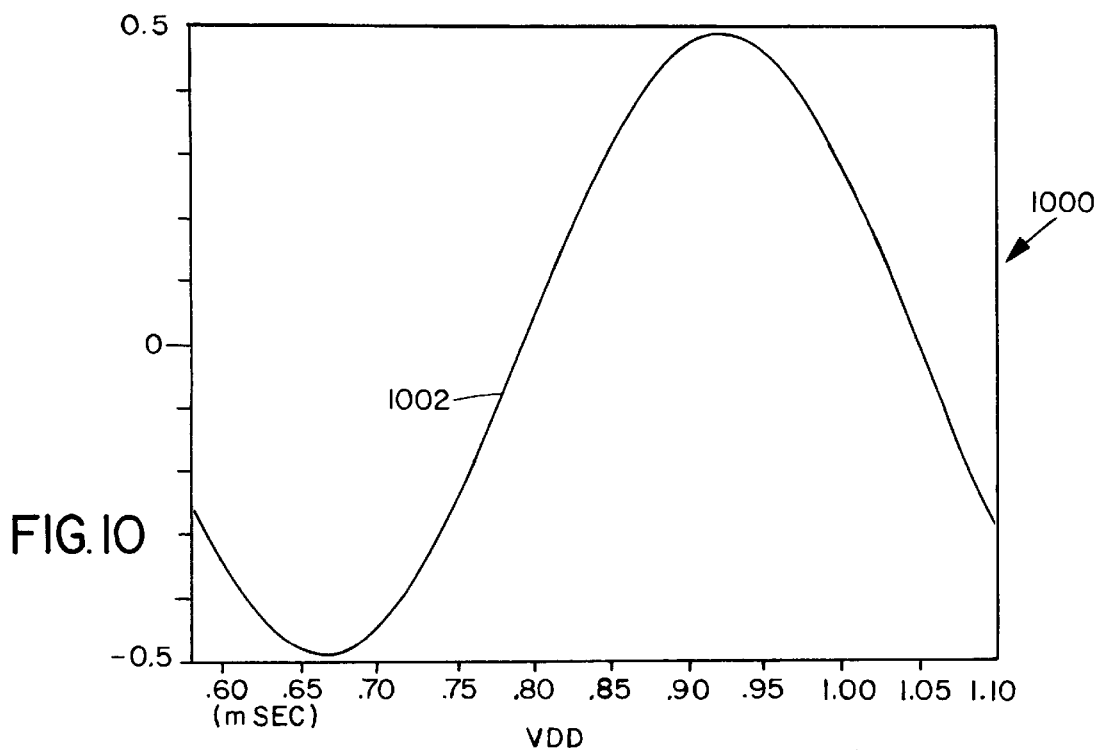
FIG. 10 is a plot showing the sinusoidal output of the second-order demodulator.

FIG. 10 shows a plot of the output of the second-order demodulator 100, and is generally designated 1000. Plot 1000 shows trace 1002 having a fundamentally sinusoidal shape and an amplitude of approximately +0.5 to −0.5 volts, and a frequency of approximately 3850 Hz. As shown, the curvature of the trace 1002 is smooth, indicating that a high quality analog signal is obtained and analog post-filtering is no longer required following demodulation using a second-order demodulator 100.

Figure 11:
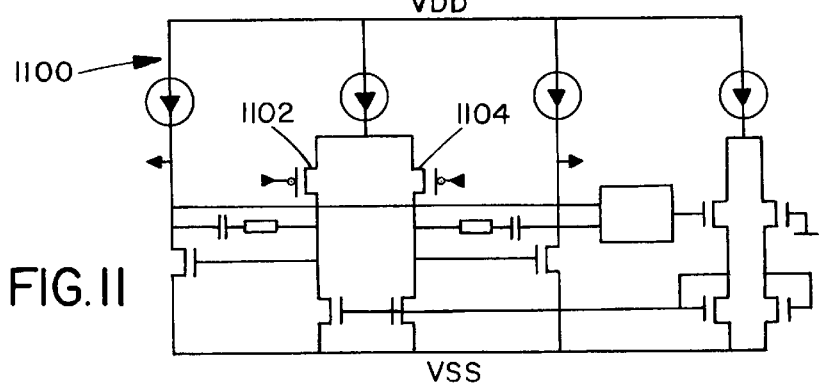
FIG. 11 is a schematic diagram showing the low power operational amplifier circuit.

FIG. 11 shows a typical circuit schematic of an operational amplifier used within the demodulator 100, and is generally designated 1100. As shown, schematic 1100 is a fully differential structure with a switched capacitor common mode feedback circuit. Such architecture is beneficial because of its power supply rejection ratio (PSRR) and common mode rejection ratio (CMRR) requirements of the DAC. Schematic 1100 shows the low power operational amplifier with an appropriate current through the input differential PMOS transistor pair 1102, 1104. These balanced transistors, in combination with the long channel loading devices, help in reducing the 1/f and other thermal noise. Further reductions in the noise levels present, such as from mismatching, common mode noise coupling, and resistance noise, may be obtained by using careful layout design techniques, such as mirrored and common centroid structures.

As designed, the simulated operational amplifier 1100 performance is provided in Table 4.

TABLE 4

| | |
|---|---|
| DC Gain | 75 dB |
| Gain Band Width | 8 MHz |
| Slew Rate | 20 V/$\mu$s |
| Phase Margin | 70 degrees |
| Input Noise | 10 $\mu V_{RMS}$ (300–3400 Hz) |
| Power Supply Rejection | 85 dB (20 kHz) |
| Common Mode Rejection | 100 dB |
| Common Feedback Gain | 85 dB |
| Power Consumption | 280 $\mu W$ |
| Temperature Range | −40 C. to 100 C. |
| Supply Voltage | 2.4 Volts |

Figure 12:
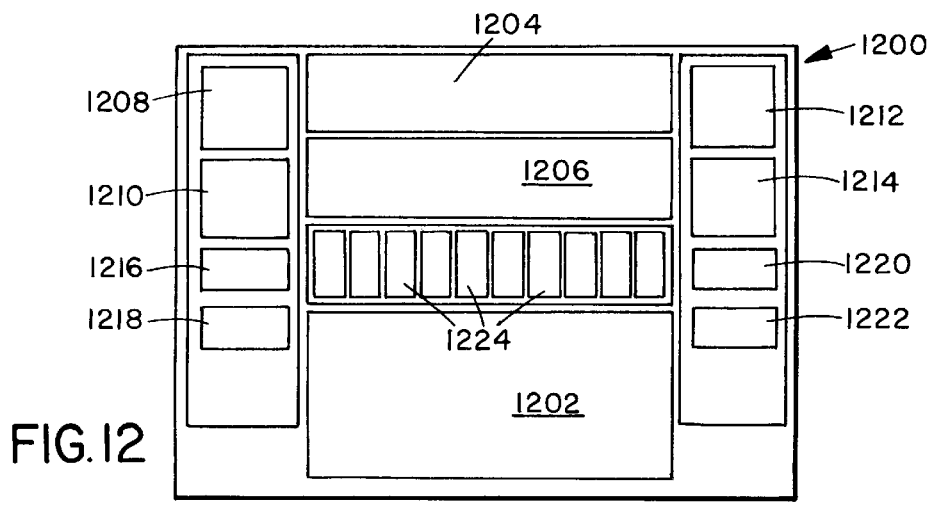
FIG. 12 is a CMOS integrated circuit chip layout for the second order demodulator showing the clock generating circuitry, capacitor banks, switches, and operational amplifier.

FIG. 12 is a representation of a microphotograph showing the layout of the active area of the demodulator, and is generally designated 1200. Layout 1200 includes a operational amplifier 1202, a clock generator 1204, a switch bank 1206, and an array of capacitors 1208 through 1224. As shown, the area occupied by the demodulator 100 is less than 0.18 mm$^2$. As can be seen, capacitors occupy much of the area required for the layout of the demodulator. Nonetheless, this still represents an improvement since the area required for post analog filtering would be much greater. As a result, by incorporating the capacitors and switches to create a second pole into the demodulator, valuable component area is preserved. Moreover, as a result of the elimination of the secondary analog post-filtering, an entire operational amplifier is eliminated, resulting in an even greater savings in terms of power required for the sigma-delta DAC.

It will be apparent to those skilled in the art that various modifications and variation can be made in the system of the present invention without departing from the spirit or scope of the invention. Thus, it is intended that the present invention cover the modification and variations of this invention provided they come within the scope of the appended claims and their equivalence.

We claim:

1. A demodulator for use in a sigma-delta DAC comprising:

an input circuit having a first output and a second output, said input circuit receiving a digital data signal and alternatively connecting a positive reference voltage to one of said first output and said second output and a negative reference voltage to the other of said first output and said second output;

a first switched capacitor circuit having an input and an output, said input connected to said first output of said input circuit;

a second switched capacitor circuit having an input and an output, said input connected to said second output of said input circuit;

a first capacitor having a first lead and a second lead, said first lead connected to said output of said first switched capacitor circuit and said second lead connected to said output of said second switched capacitor circuit;

an operational amplifier having a positive input, a negative input, a positive output and a negative output;

a second capacitor having a first terminal connected to said positive input of said operational amplifier and a second terminal connected to said negative output of said operational amplifier;

a third capacitor having a first terminal connected to said negative input of said operational amplifier and a second terminal connected to said positive output of said operational amplifier;

a third switched capacitor circuit having an input and an output, said input connected to said first lead of said first capacitor and said output connected to said negative output of said operational amplifier;

a fourth switched capacitor circuit having an input and an output, said input connected to said first lead of said first capacitor and said output connected to said positive input of said operational amplifier;

a fifth switched capacitor circuit having an input and an output, said input connected to said second lead of said capacitor first and said output connected to said negative input of said operational amplifier;

a sixth switched capacitor circuit having an input and an output, said input connected to said second lead of said first capacitor and said output connected to said positive output of said operational amplifier;

wherein said digital data signal is received by said input circuit and propagates through said switched capacitor networks to generate an output signal from said operational amplifier, said output signal being an analog signal having second-order filtering.

2. A demodulator for use in a sigma-delta DAC, comprising:

a conventional first-order demodulator having an output; and a filtering means within said demodulator for introducing an additional order of filtering to said output of said conventional first-order demodulator, the filtering means comprising a pair of switched capacitor legs and a fixed capacitor and having a reduced power consumption relative to a power consumption of an active filter.

3. In a demodulator comprising an input circuit having a first output and a second output, said input circuit receiving a digital data signal and alternatively connecting a positive reference voltage to one of said first output and said second output and a negative reference voltage to the other of said first output and said second output, a first switched capacitor circuit having an input and an output, said input connected to said first output of said input circuit, a second switched capacitor circuit having an input and an output, said input connected to said second output of said input circuit, an operational amplifier having a positive input connected to said output of said first switched capacitor circuit, a negative input connected to said output of said second switched capacitor circuit, a positive output and a negative output, a first capacitor having a first terminal connected to said positive input of said operational amplifier and a second terminal connected to said negative output of said operational amplifier, a second capacitor having a first terminal connected to said negative input of said operational amplifier and a second terminal connected to said positive output of said operational amplifier, a third switched capacitor circuit having an input and an output, said input connected to said positive input of said operational amplifier and said output connected to said negative output of said operational amplifier, a sixth switched capacitor circuit having an input and an output, said input connected to said negative input of said operational amplifier and said output connected to said positive output of said operational amplifier, wherein said digital data signal is received by said input circuit and propagates through said switched capacitor networks to generate a differential output signal from said operational amplifier, said output signal being an analog signal having a second-order filtering, an improvement comprising:

a third capacitor having a first lead and a second lead, said first lead connected to said output of said first switched capacitor circuit and said second lead connected to said output of said second switched capacitor circuit;

a fourth switched capacitor circuit having an input and an output, said input connected to said first lead of said third capacitor and said output connected to said positive input of said operational amplifier; and a fifth switched capacitor circuit having an input and an output, said input connected to said second lead of said third capacitor and said output connected to said negative input of said operational amplifier.

4. A sigma-delta digital-to-analog converter comprising:

a digital sampler for digitally sampling a digital input signal, said digital sampler having an output signal;

a modulator having an input for receiving said output signal of said digital sampler and creating a second output signal, said modulator modulating said output signal thereby shaping said second output signal such that any noise is outside the frequency band of interest; and a second-order demodulator having an input for receiving said second output signal, said second-order demodulator comprising a first order demodulator and a pair of switched capacitor circuits for providing a second-order filter response without an operational amplifier thereby lowering the signal level of said noise in said second output signal.

5. A second-order demodulator comprising:

a first-order demodulator for receiving an input digital signal and converting said input digital signal into a digital data stream, said first-order demodulator including an operational amplifier having two inputs, a first plurality of switch capacitors, and a plurality of clock phase signals for selectively and sequentially activating the first plurality of switch capacitors;

a second plurality of switch capacitors, each having an input and an output, the output of one switch capacitor of the second plurality of switch capacitors being connected to each of the two inputs of said operational amplifier; the input of each switch capacitor of said second plurality of switch capacitors being connected to each other; and a capacitor disposed at the connection between the second plurality of switch capacitors;

wherein each of the second plurality of switch capacitors is connected to said plurality of clock phase signals so that activation of the second plurality of switch capacitors is coordinated with activation of the first plurality of switch capacitors to provide second-order low pass filtering.

6. A method of reducing the power consumption and circuit area of a sigma-delta DAC, comprising:

providing an input circuit for receiving a digital data signal having a first output and a second output, said input circuit receiving a digital data signal and alternatively connecting a positive reference voltage to one of said first output and said second output and a negative reference voltage to the other of said first output and said second output;

providing a first switched capacitor circuit for connection to said first output of said input circuit;

providing a second switched capacitor circuit for connection to said second output of said input circuit;

providing a capacitor having a first lead and a second lead, said first lead being connected at the output of said first switched capacitor circuit and said second lead of said capacitor being connected to said output of said second switched capacitor circuit;

providing a third switched capacitor circuit for connecting to said first lead of said capacitor;

providing a fourth switched capacitor circuit for connection to said first lead of said capacitor;

providing a fifth switched capacitor circuit to said second lead of said capacitor;

providing a sixth switched capacitor circuit for connection to said second lead of said capacitor;

providing an operational amplifier having a positive input, a negative input, a positive output, and a negative output;

providing a second capacitor having a first lead and a second lead;

providing a third capacitor having a first lead and a second lead;

connecting said positive input of said operational amplifier to the output of said fourth switched capacitor circuit, and to the first lead of a second capacitor;

connecting the negative input of said operational amplifier to the output of said fifth switched capacitor circuit, and to the first lead of a third capacitor;

connecting the negative output of said operational amplifier to the output of said third switched capacitor circuit, and to the second lead of said second capacitor;

connecting the positive output of said operational amplifier to the output of said fourth switched capacitor circuit, and to the second lead of said third capacitor;

wherein said digital data signal is received by said input circuit and propagates through said switched capacitor networks to generate a differential output signal on said positive output and said negative output from said operational amplifier, said output signal being an analog signal having second-order filtering.

7. A method of reducing the power consumption and circuit area of a conventional sigma-delta DAC, comprising:

providing a conventional first-order demodulator having an input for a digital data stream, the conventional first-order demodulator including a demodulator circuitry; and integrating a filtering means within the demodulator circuitry of said demodulator for introducing an additional order of filtering to said output of said conventional first-order demodulator, wherein the filtering means is a complementary pair of switched capacitor circuits for providing an additional phased switching.

8. A method for eliminating an active post filter in a second-order demodulator comprising:

providing a first-order demodulator for receiving an input digital signal and converting said input digital signal into a digital data stream, said first-order demodulator having an operational amplifier having two inputs, a first plurality of switch capacitors and a plurality of clock phase signals for activating the first plurality of switch capacitors;

providing a second plurality of switch capacitors, each having an input and an output;

connecting the output of one switch capacitor of the second plurality of switch capacitors to each of the inputs of said operational amplifier;

providing a capacitor for interconnecting the inputs of the second plurality of switch capacitors; and connecting the second plurality of switch capacitors to the plurality of clock phase signals so that activation of the second plurality of switch capacitors is coordinated with activation of the first plurality of switch capacitors;

wherein the capacitor for interconnecting and the second plurality of switch capacitors, when activated by the plurality of clock phase signals, provides second-order low pass filtering.

* * * * *